March 30, 1954 J. R. HARRIS 2,673,936

DIODE GATE

Filed April 28, 1952 2 Sheets-Sheet 1

INVENTOR
J. R. HARRIS
BY H. A. Burgess
ATTORNEY

March 30, 1954 J. R. HARRIS 2,673,936

DIODE GATE

Filed April 28, 1952 2 Sheets-Sheet 2

INVENTOR
J. R. HARRIS
BY H. A. Burgess
ATTORNEY

Patented Mar. 30, 1954

2,673,936

UNITED STATES PATENT OFFICE 2,673,936

DIODE GATE

James R. Harris, Dover, N. J., assignor to Bell Telephone Laboratories, Incorporated, New York, N. Y., a corporation of New York Application April 28, 1952, Serial No. 284,769

7 Claims. (Cl. 307—88)

This invention relates to electronic gating circuits and more particularly to the reduction of direct current power drain in such circuits.

The invention is described below as relating to a class of gates commonly called diode gates or switches. This type of gate has assumed increased importance due to the development of improved semiconductor diodes, such as germanium crystal "cat whisker" diodes or p-n junction diodes, formed, for example, from germanium or silicon. Such devices are essentially asymmetrically conducting impedance elements having a low forward impedance and a high, although not infinite, reverse impedance. The small size, low operating temperature, and high speed switching possibilities of these devices make them relatively ideal for packaged switching circuits which may be employed, for example, in either large or small scale digital computing devices. With packaged circuits particularly, the problem of direct current power drain becomes a major consideration, and even relatively small savings in power are much to be desired.

A principal object of the invention, therefore, is to decrease the direct current power drain in electronic gating circuits.

A more particular object of the invention is to decrease the peak power drain imposed on the control voltage source by the gating circuit itself.

A further object is to permit the use of a control voltage source having low power output capability and low direct current power drain.

An illustrative embodiment of the invention described in more detail below comprises a plurality of semiconductor diodes connected by like electrodes to a common junction; a direct current bias is also applied to the junction. A load circuit is connected to one of the diodes, and control voltages are applied to the remaining diodes. The control voltages are derived from the stages of a binary counter which is triggered in a regular manner. Following each stepping of the counter, a "clock" pulse is applied to the junction mentioned above. If any of the diodes is in its low resistance condition, i. e., if it is in the disabling condition, the clock pulse will be bypassed through the disabled diodes to ground; the direct current bias holds the output diode OFF under such a condition. If all of the control voltages are of the proper polarity to bias their associated control diodes in their high resistance condition, i. e., if all control diodes are in the enabling condition, the clock pulse will overcome the bias on the output diode and pass to the load circuit.

Were the circuits contemplated by the present invention not employed, control voltage sources in the disabling condition would be subjected to an undesirable power drain upon the occurrence of a clock pulse. In accordance with the principles of the invention, however, a shunt condenser is connected to the control terminal of each control diode. These condensers are charged slowly by the control voltage sources, following each stepping of the binary counter, through a properly proportioned resistor.

The clock pulses are delayed a sufficient time interval following each stepping of the counter to permit the condensers to charge substantially to the full control voltage. When a clock pulse passes through a control diode, it in effect "sees" a low impedance path to ground through the condenser which is discharged partially by the clock pulse. The condensers, therefore, effectively isolate the control voltage sources from the clock pulses and substantially eliminate the peak power drain which would otherwise be caused by these pulses. A feature of the invention is that control sources (e. g., binary counter stages), which have high output resistance, low power output capability, and correspondingly low direct current power drain may be used.

Other objects and features of the invention will be understood from a consideration of the following detailed description when read in accordance with the attached drawings, in which.

Figure 1:
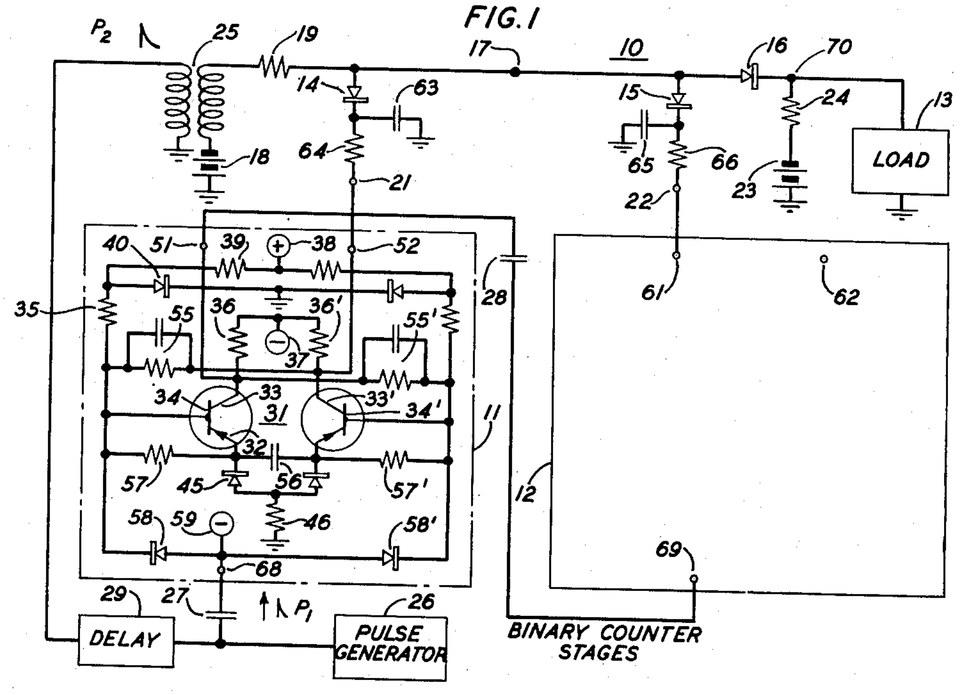
Fig. 1 is a circuit diagram of a diode gate employing principles of the present invention.

The circuit illustrated in Fig. 1 includes a pulsed diode gate 10 which is connected to recognize a specific count of a two-stage binary counter comprising the counter stages 11 and 12. The gate 10 will deliver a pulse to the load 13 upon a recognition of this specific count. The gate 10 comprises the p-n junction diodes 14, 15, and 16 connected by like electrodes to a junction designated 17. Diodes of this type are described in Patent 2,402,662 to R. S. Ohl, dated June 25, 1946. The diodes 14 and 15 are called control diodes, and the diode 16 is termed the output diode, since the desired pulse must pass through this latter diode to reach the load 13. The gate as thus far described is similar to a switching type gate described in a copending application of L. W. Hussey, Serial No. 198,688, filed December 1, 1950, which issued as Patent 2,636,133 on April 21, 1953. A direct current bias is applied to the junction 17 by the battery 18 through the resistor 19. The bias voltage applied to the junction 17 by the battery 18 in the absence of pulse $P_2$ is so chosen as to be always slightly more positive than the most positive potential which will exist at a control input lead, i. e., at the terminals 21 and 22 for the disabling state. A further bias is applied to the output diode 16 by the battery 23 through the resistor 24. The purpose of this bias is to keep the output diode 16 non-conducting except when the control voltages are such as to enable the gate and pulse $P_2$ to be applied. This bias is selected such that the voltage at junction 70 is slightly more positive than the most positive voltage which appears at junction 17 during input pulse $P_2$ when the control voltages are set to disable the gate.

The operation of the gate shown in Fig. 1 differs from the gate described in the Hussey application mentioned above in several respects. Whereas the gate described in the Hussey application delivers current from a direct current source (connected to junction 17) upon a proper coincidence of control voltages, the biasing voltages of the gate shown in Fig. 1 are so proportioned that the voltage at the junction 17 is insufficient to overcome the reverse bias on the output diode 16 even when all of the control voltages are enabling. As a substitute for the current delivered by the direct current source, a short pulse is applied to the junction 17 by way of the transformer 25 and will, if the control voltages are all enabling, overcome the reverse bias of the output diode 16 and pass to the load. By "enabling" control voltages is meant control voltages which tend to enable the gate to permit a pulse to pass to the load; in Fig. 1, the gate 10 will be enabled if both control voltages are positive (relatively speaking) so as to bias the control diodes in their high resistance condition. Conversely, "disabling" voltages are those which disable the gate; in Fig. 1, the more negative of the two negative control voltages is the disabling voltage.

The gating circuit 10 of Fig. 1 can be expanded to accommodate more controls by adding further control diodes connected to junction 17. "P-N junction" diodes are employed in the illustrative embodiment because of their relatively high reverse impedance which permits the addition of more controls without unduly loading the pulse input supply, to be described below.

The operation of the circuit as thus far described, and omitting for the present the modifications in accordance with the present invention, is as follows. A pulse generator 26 applies a pulse $P_1$ through the condenser 27 to the first stage 11 of the binary counter. Counter stage 11 is a bistable circuit, described in more detail below, which will assume its opposite stable state upon the application of a trigger pulse. The stage 11 is coupled to the stage 12 through the condenser 28, and the two stages will "count" in binary fashion in a well-known manner, the two stages being capable of counting up to four. The same pulse which triggers the binary counter is delayed by the delay circuit 29 and, as pulse $P_2$, is applied to the transformer 25 and thence to the junction 17. The delay provided by the delay circuit 29, among other things, permits the binary counter to settle down. If at this time the voltages at terminals 21 and 22 are both enabling, the control diodes 14 and 15 will be biased "off," and the delayed pulse applied to the junction 17 will pass to the load 13. However, if either or both control voltages are disabling, the positive pulse will be blocked and will not pass to the load.

For the present, assume that at each pair of counter stage output terminals 51—52 and 61—62, there will be available two potentials, both negative, with one more negative than the other by an appreciable amount. These potentials are determined by the voltage of source 37 and the voltage drop across resistors 36 and 36'. The source 37 may be common to both stages 11 and 12.

As mentioned above, if the potentials of both terminals 21 and 22 are positive, i. e., the less negative of their two values, the junction 17 will rise to the potential of the battery 18, since both diodes 14 and 15 will be biased in their high resistance conditions by "positive" control voltages. This potential is sufficiently negative with respect to the voltage at junction 70 due to battery 23 that the diode 16 will remain in its high resistance condition and block current from battery 18 but will pass a positive pulse of sufficient amplitude applied to the junction by way of transformer 25.

Assume, however, that the control terminal 21 is at the more negative control potential and that a positive pulse $P_2$ is impressed on the transformer 25. Junction 17 will be more positive than terminal 21 so that the diode 14 will be a low resistance (e. g., a few hundred ohms). It is necessary that the source as "seen" by the control terminal of diode 14 be a low impedance; otherwise pulse $P_2$ would develop positive voltage on junction 17 such as to transmit a spurious pulse to the load 13 through output diode 16 or else the voltage of battery 23 would have to be increased, thus reducing the signal available at the load 13. It is desirable for a control diode which is set to disable the gate to become a low impedance without delay when the pulse $P_2$ appears. It has been found that this is facilitated with certain diodes if there has been a small forward current in the diode prior to the application of the large forward current due to pulse $P_2$. This is the reason for choosing the voltage of battery 18 such that even in the absence of pulse $P_2$, junction 17 is more positive than the disabling control voltage.

If the control potential at terminal 52 were applied directly to the electrode of the diode 14 remote from the junction 17, i. e., if the condenser 63 and resistor 64 were omitted, the relatively heavy current due to pulse $P_2$ would flow in terminal 52 of the binary counter stage 11 (control voltage source) when control diode 14 is in its low resistance state. Thus, the stage 11 would have to be capable of passing these pulse currents in terminal 52 without changing falsely to its other state. This may be a serious disadvantage. Also, the impedance "seen" looking into terminal 52 of stage 11 would have to be relatively low to give proper and efficient operation of the gate. This last requirement means (assuming that the control voltages required by the gate are fixed) that the source stage 11 would have to draw relatively larger direct current power, and the electronic devices 31 would dissipate relatively large direct current power. The requirements would be even more stringent if more than one control diode were fed from the same source.

The same, of course, would be true for the source terminal 61 associated with counter stage 12 were the condenser 65 and resistor 66 omitted.

In accordance with principles of the present invention, however, shunt condensers 63 and 65 are connected to the control electrodes of the control diodes 14 and 15. These condensers are charged, through properly proportioned resistors 64 and 66, to the potentials existing at output terminals 52 and 61, respectively. The time constants of these RC combinations are fairly large so that when the control potential at terminal 52 or 61 changes, its associated condenser charges fairly slowly to the potential of the control voltage, thereby requiring but a small charging current and greatly reducing the peak load on the counter stages. Delay circuit 29 provides sufficient delay for the condensers 63 and 65 to charge substantially to the full potential of their associated control terminals 21 and 22 before the delayed pulse $P_2$ is applied to the junction 17 of the gate 10. If the delay pulse $P_2$ should find either control diode set to disable, it would then merely discharge its associated shunt condensers 63 and 65 and would not drain appreciable current from the counter stages.

The condensers 63 and 65 provide a very low impedance shunt path to the input pulses $P_2$ when the associated control diode is conducting, thus allowing efficient operation of the gate. The condensers 63 and 65 in combination with resistors 64 and 66 prevent the flow of large currents in the output terminals 52 and 61 of sources 11 and 12, thus protecting sources 11 and 12 from the relatively large current from pulse $P_2$. Thus, the invention permits the use of source stages 11 and 12 having high impedance, low direct current power drain, and low power output capability, or, conversely, permits much higher pulse current in load 13 with given sources 11 and 12.

The condensers 63 and 65 and the resistors 64 and 66 also perform other functions that are particularly useful if there is appreciable shunt capacity in the impedance of iodes 14, 15, and 16. They prevent any sharp wave fronts from a binary counter, when reversing, from being transmitted to another binary counter or to the load 13.

The illustrative binary counter stage 11 is similar to the one shown and described in a copending application of A. E. Anderson and R. L. Trent, Serial No. 246,833, filed September 15, 1951, which issued as Patent 2,622,212 on December 16, 1952. Each half of the counter is a transistor trigger circuit of the type shown and described in a copending application of R. L. Trent, Serial No. 223,522, filed April 28, 1951, which issued as Patent 2,622,211 on December 16, 1952. Looking at the left half of the counter 11, for example, this trigger circuit comprises the transistor 31 having an emitter electrode 32, a collector electrode 33, and a base electrode 34. A relatively large resistor 35 is connected to the base electrode and promotes regenerative feedback from the collector circuit to the emitter circuit. The collector circuit may be traced from the collector electrode 33 through resistor 36, the negative voltage collector supply 37 to ground, through the parallel combination of the grounded source 38, resistor 39, and diode 40, resistor 35 to the base electrode 34. The emitter circuit may be traced from the emitter electrode 32 through the diode 45, resistor 46 to ground, and returning to the base electrode 34 through the parallel combination of the grounded source 38, resistor 39, and diode 40, and the resistor 35.

In the negative emitter current region, the diode 40, biased by current from source 38 which flows through resistor 39, is a low impedance and effectively switches the large base resistance provided by resistor 39 out of the circuit. When the emitter current becomes positive, however, the diode becomes a high impedance and effectively switches the resistor 39 into the base circuit to provide additional regenerative feedback which gives rise to the trigger properties of the circuit. The resistor 35 insures that there will be sufficient resistance in the base circuit to provide enough regeneration to promote instability as soon as the emitter current becomes positive, even though the diode 40 may not reverse until some positive emitter current is reached. The load line resistor 46 is proportioned to give the circuit two stable operating points, one in the negative emitter current region characterized by low collector current and a collector voltage (and hence terminal 51 voltage) of approximately −30 volts, and the other one in the positive emitter current region characterized by high collector current and a collector voltage of approximately −10 volts.

The right-hand trigger circuit is similar in all respects, and the same numbers with the addition of primes are used to indicate similar elements. The two trigger circuits are interconnected by the resistor-condenser couplings 55 and 55′ which cross-couple the collector and base electrodes, and by the common load line resistor 46. When one trigger circuit is switched "on," the other will be switched "off" by the cross-connections just described. The diodes 45 and 45′ and the condenser 56 cooperate to promote trigger sensitivity. These diodes raise the emitter potential of the "off" unit to a potential quite near the trigger point but have substantially no effect on the emitter potential of the "on" unit. Resistors 57 and 57′ also promote trigger sensitivity as well as reliablity. Condenser 56 aids in commutation and insures that once the trigger circuits start to reverse states, they will continue in that direction until they reach the opposite stable state.

Trigger pulses are applied to the base electrodes 34 and 34′ through the steering diodes 58 and 58′. Due to the differences of potential between the base electrode of the "on" unit and the base of the "off" unit and aided if necessary by bias from the source 59, the diode connected to the base of the "on" unit will be in its low impedance condition while the other diode will be a high impedance. Trigger pulses are therefore "steered" to the base electrode of the "on" unit. These pulses, being positive, tend to turn the "on" unit "off" and, being passed by the low emitter to base internal resistance of the "on" transistor through condenser 56 to the emitter of the "off" unit, tend to turn the "off" unit "on." The cross-couplings 55 and 55′ increase these tendencies which become cumulative so that the trigger circuits rapidly reverse states. The potentials at terminals 51 and 52 also reverse, one assuming a potential of −10 volts (the "on" unit) and the other −30 volts. Output may be taken from either of these terminals.

The counter stage 12 is similar to the stage 11 just described. Count input pulses are applied to an input terminal 69 similar to the input terminal 68 of stage 11. These pulses are not derived directly from the generator 26, however, but are derived from the preceding stage. A positive going pulse will appear at output terminal 51 each time the left-hand trigger circuit of this stage triggers from "off" to "on," and it is this pulse which triggers the next stage. It may be seen that the second stage counts at a rate one half that of the first stage; if succeeding stages were added, they, too, would each reverse or count at a rate of one half the rate of the next preceding stage.

Figure 2:
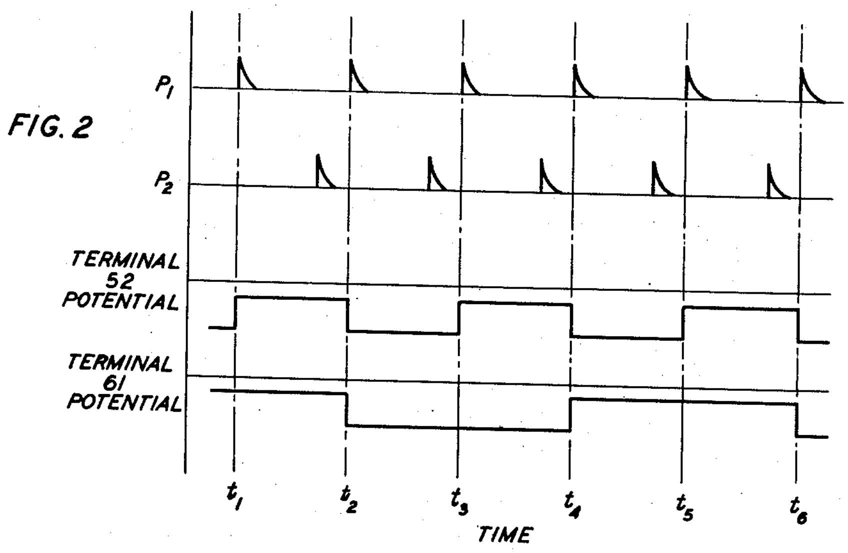
Fig. 2 is a timing diagram illustrative of the operation of the circuit of Fig. 1.

The output terminals 61 and 62 of stage 12 produce voltages similar to those at terminals 51 and 52 although at a different rate. Output control voltages may be derived from either terminal of each pair, depending on the time in the cycle it is desired to energize the gate 10. By way of example, and assuming the left-hand trigger circuits of each stage to be ON upon the receipt of the initial trigger pulse from the generator 26, the potentials at terminals 52 and 61 are illustrated in the timing diagram of Fig. 2; occurrence times of the trigger pulses are illustrated by $P_1$ and the delayed pulses which are applied to the gate 10 by $P_2$.

Pulse $P_1$ at time $t_1$ reverses stage 11 so that terminal 52 assumes the less negative of its two possible potentials (−10 volts in the example given) designated "positive" herein; terminal 61 is already positive by the initial assumption and is undisturbed. The delayed pulse $P_2$ in the time interval $t_1$ to $t_2$ will therefore find the gate completely enabled and will pass to the load 13. Pulse $P_1$ at time $t_2$ will reverse counter stage 11 which will in turn reverse counter stage 12 so that the pulse $P_2$ in the time interval $t_2$ to $t_3$ will find the gate disabled and will not be transmitted to the load. From a study of the timing diagram, it may be seen that the gate 10 will be enabled but one time interval out of each successive four, and if $t_1$ is assumed to be the beginning of a frame, the gate will be enabled for the first pulse $P_2$ in each frame.

If, for example, a third control arm is added to the gate 10 and a third counter stage is added to the counter to produce control voltages for this added control arm, it may be seen that, since the counter thus expanded can count to $2^3$, or 8, the modified gate, by selection of a proper control terminal from each counter stage, could recognize any one count of an eight-pulse frame; for example, it could deliver a pulse to the load 13 upon the occurrence of a second or fifth or seventh, etc., count pulse, as desired. As is known, a unique combination of enabling control terminals is available for any desired count, provided the counter has a sufficient number of stages; this combination will not enable the gate at any other count.

Figure 3:
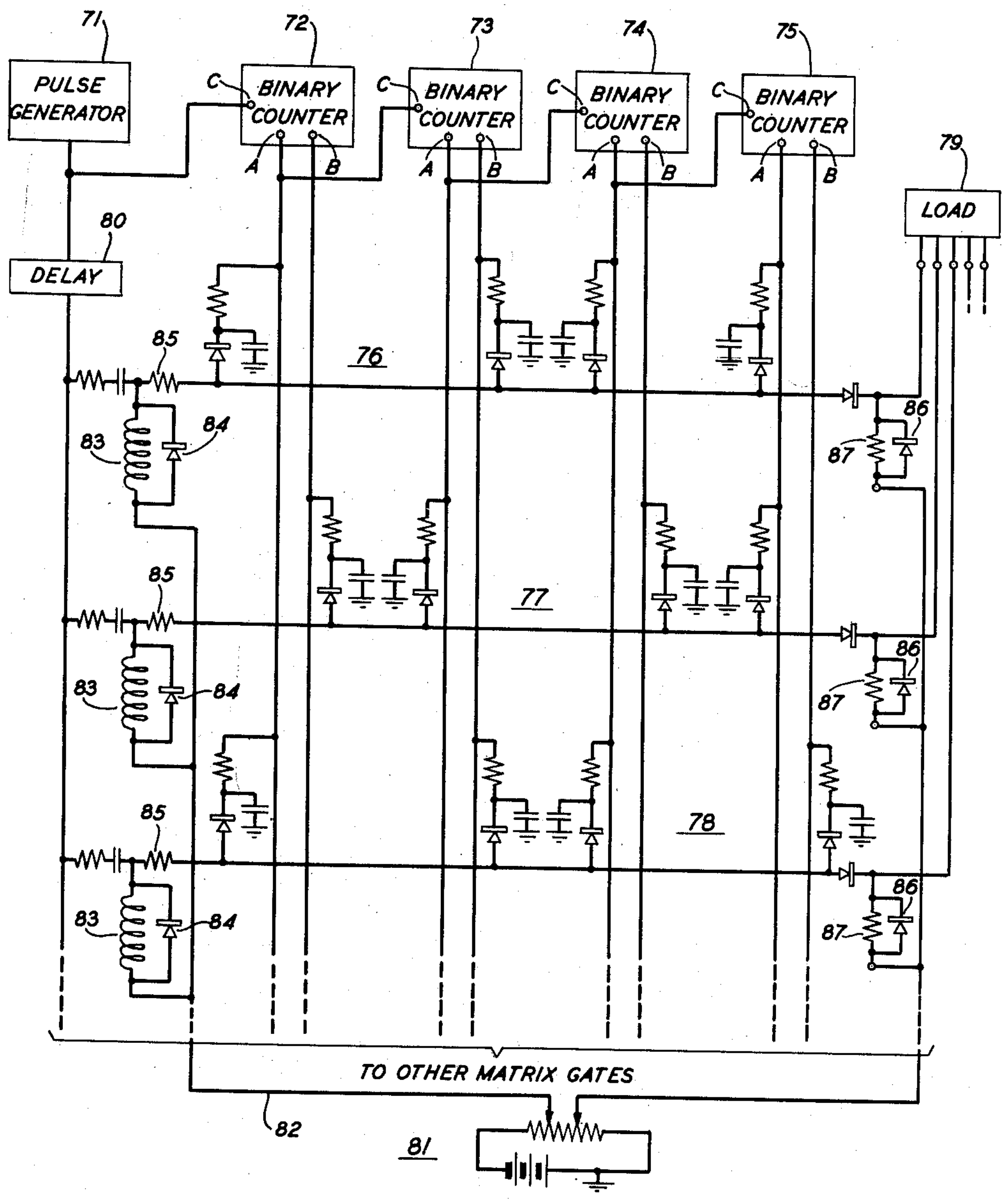
Fig. 3 is a circuit diagram of a program generator which also employs principles of the present invention.

Fig. 3 illustrates an application of principles of the invention to a program generator. Fundamentally, the program generator consists of four binary counters, pulsed diode matrix gates similar to those illustrated in Fig. 1, and a master clock. The master clock is the pulse generator 71 which may, for example, comprise a crystal controlled oscillator which delivers count pulses at the fundamental programming rate to the first counter stage 72. The counter, including stages 72–75 will thus count in a regular manner at this fundamental rate, completing a cycle of operation every $2^4$, or 16, pulses.

A fundamental property of binary counters which is used to obtain recognitions of specific counts is the condition that a unique combination of counter stage output potentials corresponds to each specific count. The matrix gates 76, 77, 78, . . . are therefore connected to the counter stage outputs in such fashion that when a specific count desired to be recognized is attained, the gate will respond, producing an output in the form of a pulse which is delivered to the load 79. At all other conditions of the counter outputs, at least one of the control diodes prevents any response.

Each counter stage has two output leads. The lead which is chosen arbitrarily to define whether a stage is "on" (−10 volts) or "off" (−30 volts) is designated B in Fig. 3. The output lead (of the same stage) designated A will always have the opposite condition. A control diode connection to a matrix gate is made to the particular binary counter output lead which will be in the −10 volt condition at the desired count. The control diode connections of matrix gate 76 are made to output leads ABAA of the counter stages 72–75, respectively; this gate will therefore deliver a pulse to the load 79 at a count of 2. Matrix gate 77 will deliver a pulse to the load at a count of 5 and gate 78 at a count of 10. The pulses applied to the load 79 may, for example, be programming pulses which control the timing of desired operations in the load circuit. The counter may easily be translated into a decade type by utilizing the pulse delivered by matrix gate 78 upon a count of 10 to reset each of the counter stages 72–75 to their starting condition; interstage gates, disabled during the resetting operation, would assist in performing this function.

The output from the basic frequency pulse generator 71 is impressed upon the count lead C of the first binary counter stage 72 and also upon all of the matrix gates through a delay circuit 80. This delay 80 functions similarly to the delay 29 in Fig. 1 and permits the binary counter stages to operate and the shunt storage condensers associated with each control diode to be charged. When all of the control inputs to a particular matrix gate are enabled, the delayed pulse is transmitted to the load.

The matrix gates shown in Fig. 3 have been bodified from those illustrated in Fig. 1 in several respects. First, bias is applied to each gate from source 81 over lead 82 through choke coils 83 shunted by diodes 84. These provide a high alternating current impedance to the delayed input pulses and a low direct current impedance bias feed. The shunt diodes 84 suppress any reverse kick produced by the retard coils. The small series resistors 85 inserted between the control diodes and the retard coils among other things limit the pulse current in the disabling condition. The shunt diodes 86 across the biasing resistors 87 associated with the output diodes suppress any negative pulses which may leak through the output diode due to delayed switch-off or low reverse impedance.

Although the invention has been described as relating to specific embodiments, it should be understood that the invention is not limited to the apparatus or circuital arrangements specifically described, since other embodiments and modifications will readily occur to one skilled in the art without departing from the invention. By way of example, the control voltage sources need not be interdependent as illustrated but could operate independently at random or in response to either local or remote controlling circuits.

What is claimed is:

1. An electronic gate comprising a plurality of two-terminal asymmetrically conducting impedance elements each having a first terminal connected to a junction, a source of direct current connected to said junction, a source of pulses, means for applying said pulses to said junction means for deriving an output from the second terminal of one of said asymmetrical impedance elements, a plurality of control potential sources, one for each of the remaining asymmetrical impedance elements, said control potentials each having either a first or a second value, and means comprising a series resistor and a shunt capacitor for uniquely applying said control potentials to the second terminals of said remaining asymmetrical impedance elements.

2. In combination, a binary counter having a plurality of tandem stages, an electronic gate having a plurality of control means, a source of pulses connected to the input of said gate, a load circuit connected to the output of said gate, a storage capacitor connected to each of said control means, and means for charging each of said capacitors to a potential derived from one of said tandem stages.

3. In combination, an electronic gating circuit having an input, an output, and a plurality of shunt control arms each including an asymmetrically conducting impedance element, a shunt capacitor connected to each of said control arms, a binary counter having a plurality of tandem stages, means for charging each of said capacitors to a potential derived from one of said tandem stages comprising a resistor connecting each of said control arms to an output terminal of one of said tandem stages, means for applying counting pulses to said binary counter, means for applying a pulse to the input of said gate after the application of each counting pulse to said binary counter, said resistors and capacitors proportioned to utilize the major portion of the interval between each pair of consecutive counting pulses for charging said capacitors, and means for delaying the application of said pulses to the input of said gate by an amount following the preceding counting pulses sufficient to permit said capacitors to be substantially completely charged.

4. In combination, a source of pulses, a load, and means for gating said pulses to said load only upon a coincidence of predetermined conditions comprising a first two-terminal asymmetrical impedance element connecting said source to said load, a plurality of two-terminal asymmetrical impedance elements connected to a junction between said source and said load and each poled, with respect to said junction, similarly to said first asymmetrical impedance element, a plurality of control voltage sources responsive to said conditions, a capacitor connected to the terminal of each of said asymmetrical elements remote from said junction, a resistor connected to each of said capacitors, and means for charging each of said capacitors through its associated resistors to a voltage determined by one of said control voltage sources.

5. The combination in accordance with claim 4 and means for applying a relatively large forward bias to each of said plurality of asymmetrical devices in response to the one of said predetermined conditions to which its associated control voltage source responds, and means for applying a relatively small forward bias to each of said plurality of asymmetrical devices in response to a condition other than the said predetermined condition to which its associated control voltage source responds and in the absence of said pulses.

6. The combination in accordance with claim 4 and means for applying a reverse bias to said first asymmetrical device in the absence of said pulses.

7. The combination in accordance with claim 6 wherein the said reverse bias is proportioned to be reversed by said pulses in response to said coincidence of predetermined conditions.

JAMES R. HARRIS.

References Cited in the file of this patent

UNITED STATES PATENTS

| Number | Name | Date |
|---|---|---|
| 2,541,039 | Cole | Feb. 13, 1951 |
| 2,556,200 | Lesti | June 12, 1951 |